United States Patent
Sato

(10) Patent No.: US 7,157,213 B2
(45) Date of Patent: Jan. 2, 2007

(54) DEVELOPER AGENT FOR POSITIVE TYPE PHOTOSENSITIVE COMPOUND

(75) Inventor: Tsutomu Sato, Kashiwa (JP)

(73) Assignee: Think Laboratory Co., Ltd. (JP)

( * ) Notice: Subject to any disclaimer, the term of this patent is extended or adjusted under 35 U.S.C. 154(b) by 0 days.

(21) Appl. No.: 10/788,322

(22) Filed: Mar. 1, 2004

(65) Prior Publication Data

US 2005/0191585 A1 Sep. 1, 2005

(51) Int. Cl.
*G03F 7/32* (2006.01)

(52) U.S. Cl. ............. 430/331; 430/270.1; 396/605

(58) Field of Classification Search ............. 430/331, 430/270.1; 396/605
See application file for complete search history.

(56) References Cited

U.S. PATENT DOCUMENTS

| | | | |
|---|---|---|---|
| 3,264,104 A | | 8/1966 | Maximilian |
| 4,259,434 A | * | 3/1981 | Yamasue et al. ............ 430/302 |
| 4,356,254 A | | 10/1982 | Takahashi et al. |
| 4,716,098 A | | 12/1987 | Mack et al. |
| 5,155,012 A | | 10/1992 | Joerg et al. |
| 6,100,016 A | * | 8/2000 | Denzinger et al. .......... 430/331 |
| 6,140,291 A | * | 10/2000 | Bolkan et al. ............. 510/245 |
| 6,201,110 B1 | * | 3/2001 | Olsen et al. ............... 530/402 |
| 6,258,764 B1 | * | 7/2001 | Gorlin ....................... 510/223 |
| 2002/0039703 A1 | * | 4/2002 | Hotta et al. ................ 430/302 |

FOREIGN PATENT DOCUMENTS

| | | |
|---|---|---|
| EP | 0843214 A1 | 5/1998 |
| EP | 1356928 A1 | 10/2003 |
| JP | 05-088377 | 4/1993 |

OTHER PUBLICATIONS

European Search Report dated Aug. 6, 2004.

* cited by examiner

*Primary Examiner*—Hoa Van Le
(74) *Attorney, Agent, or Firm*—Rader, Fishman & Grauer PLLC

(57) ABSTRACT

There is provided a developer agent for a positive type photosensitive compound having a near infrared wave length region laser sensitive characteristic in which a photosensitive portion of the compound exposed and reacted with a laser of the near infrared wavelength region is enabled to be dissolved in the developer liquid. This developer agent contains a) water; b) either one of or two kinds or more of tetramethyl ammonium hydroxide, benzyl triethyl ammonium hydroxide, ortho silicate soda, etc., applied as either organic or non-organic alkali capable of becoming a major material; and c) potassium pyrophosphate, tripolyphosphate soda, etc., applied as liquid agent having dampening action for preventing a reduction in pH value.

5 Claims, No Drawings

DEVELOPER AGENT FOR POSITIVE TYPE PHOTOSENSITIVE COMPOUND

BACKGROUND OF THE INVENTION

1. Field of the Invention

This invention relates to a developer agent for a positive type photosensitive compound having a near-infrared wavelength region laser sensitive characteristic in which a photosensitive portion of the compound exposed and reacted with a laser of the near-infrared wavelength region is enabled to be solubilized in the developer liquid.

2. Description of the Related Art

As the prior art positive type photosensitive compound having a near infrared wave length region laser sensitive characteristic in which a photosensitive portion of the compound exposed and reacted with a laser of the near infrared wavelength region is enabled to be dissolved in the developer liquid, it is possible to refer to the following technical documents.

[Patent Document 1] Japanese Patent Laid-Open No. Hei 10(1998)-26826

[Patent Document 2] Japanese Patent Laid-Open No. Hei 10(1998)-90881

[Patent Document 3] Japanese Patent Laid-Open No. Hei 10(1998)-161304

[Patent Document 4] Japanese Patent Laid-Open No. Hei 11(1999)-231515

[Patent Document 5] Japanese Patent Laid-Open No. Sho 61(1986)-167948

Using of the developer agent commercially available at the market in the practical gravure printing showed that developing of one roll caused the developer agent to deteriorate in quality at once and developing of the second roll and its subsequent rolls could not be performed at all.

In order to apply the developer agent practically to the gravure printing operation, it is desired to have a capability of developing at least about 100 rolls. In addition, it is also desired to have no probability that the developing capability diminishes and the developing operation cannot be carried out due to quite low aging deterioration in the processing capability when a developing operation is carried out after elapsing by 2 to 3 days through one week, and cleaning or washing is carried out again after discharging out all the developing liquid in the developing tank.

SUMMARY OF THE INVENTION

The present invention has been invented in view of the aforesaid circumstances and it is an object of the present invention to provide a developer agent for positive type photosensitive compound having no probability that the developing capability diminishes and the developing operation cannot be carried out when the developing operation is performed after elapsing by 2 to 3 days through one week, and all the developer liquid in a developing tank is discharged and replaced with new liquid because it has a capability of sufficiently developing 100 or more rolls, preferably about 300 to 400 rolls enabled to be practically applied for a process roll for a gravure printing and an aging deterioration in the processing capability is quite low.

The invention described in claim 1 of the present invention provides a developer agent for positive type photosensitive compound having a near-infrared wavelength region laser sensitive characteristic in which a photosensitive portion of the compound exposed and reacted with a laser of the near-infrared wavelength region is enabled to be solubilized in developer liquid, wherein the same is comprised of:

a) water;

b) either one of or two kinds or more of tetramethyl ammonium hydroxide, benzyl triethyl ammonium hydroxide, benzyl trimethyl ammonium hydroxide, tetrabutyl ammonium hydroxide, tetrapropyl ammonium hydroxide, ortho silicate soda, potassium hydroxide, sodium hydroxide, sal soda applied as either organic or non-organic alkali capable of becoming a major material; and c) either one of or two kinds or more of potassium pyrophosphate, tripolyphosphate soda, hexametaphosphoric soda, triphosphate soda and monophosphate soda applied as liquid agent having dampening action for preventing a reduction in pH value.

EFFECT OF THE INVENTION

In accordance with the developer agent for positive type photosensitive compound of the present invention, original liquid and water are mixed to each other to clean or wash, positive type photosensitive compound is applied to coat on the roll for a gravure printing and to form a coated photosensitive film, near-infrared wavelength region laser is illuminated and radiated, the film is exposed to the laser to draw a positive type latent image, then developing operation is carried out, resulting in that even if 300 or more rolls are processed, it keeps a pH value of 13.0 or more in a stable manner, a clear pattern can be attained in a short period of time, a superior developing state can be realized. Additionally, an aging deterioration in the processing capability is quite low, so that even if the developing operation is carried out after elapsing by 2 to 3 days through one week, there is no probability that the developing capability diminishes, the developing operation cannot be performed and all the developer liquid in the developing tank are discharged out of the tank and replaced with new developer liquid. 500 rolls could be developed and processed after supplementing new rolls corresponding to the number of processed rolls every time the roll was developed with developer liquid of 50 litters because the aging deterioration in the processing capability was quite low.

PREFERRED EMBODIMENT OF THE INVENTION

The present invention provides a developer agent for positive type photosensitive compound having a near infrared wavelength region laser sensitive characteristic in which a photosensitive portion of the compound exposed and reacted with a laser of near infrared wavelength region is enabled to be dissolved in developer liquid.

As the positive type photosensitive compound, it is possible to apply compound including alkaline soluble organic high molecular substances having at least one kind of phenolic hydroxyl group such as novolac resin, resol resin, polyphenol resin and copolymer of acrylic acid derivative having phenolic hydroxyl group; and photo-thermal conversion pigment such as organic or non-organic pigment or dye, organic pigment, metal, metal oxide, metal carbide and metal boride and the like having an absorbing band at a part of or all of the near infrared region with a wavelength region of 650 to 1300 nm so as to absorb near infrared rays and converting it into heat. It is preferable that this positive type photosensitive compound contains closeness improving agent.

It is preferable that an inclusion rate of the alkaline soluble organic high-molecular substance in the positive type photosensitive compound is 2 to 98 wt % and it is further preferable that it is 30 to 90 wt %. It is preferable that an inclusion rate of the photo-thermal conversion pigment in the positive type photosensitive compound is 2 to 60 wt % and it is further preferable that it is 3 to 50 wt %.

This positive type photosensitive compound is normally processed to become a positive type photosensitive film having the photosensitive compound layer formed on the surface of the supporting member in such a way that this compound is coated on either a copper plated surface or a copper sulphate plated surface of the process roll for gravure printing of the surface of the supporting member as solution having each of the aforesaid compositions dissolved in solvents such as Cellosolve type solvent, propylene glycol type solvent and the like, thereafter this is heated and dried with a heater or is not heated and not dried with a heater. A rate of application of the solvent in respect to a total amount of photosensitive compound is normally in a range of about 1 to 20 times by a weight ratio.

As the coating method, it is possible to apply a kiss-coating, a dip-coating, a rotary coating, a roll-coatings a wire bar coating, an air knife coating, a blade coating and a curtain coating and the like. A coating amount is preferably in a range of about 3 to 6 μm.

Alkaline soluble organic high molecular substance having phenolic hydroxyl group is a major composition to form a resist, and this is a binder resin having a low adherence to either a copper plating surface or a copper sulphate plating surface, wherein a major chain portion or side chain portion of the molecules is cut by heat, it becomes a low molecule where the alkaline soluble characteristic is further improved and a part of it is makes abilation.

As alkaline soluble organic high molecular substance having a phenolic hydroxyl group, alkaline soluble high molecular substance having a phenolic hydroxyl group described in Japanese Patent Laid-Open No. Hei 11 (1999)-231515 such as novolac resin, resol resin, polyvinylphenol resin and copolymer of acrylic acid derivative having phenolic hydroxyl group and the like can be applied as they are and in particular, novolac resin or polyvinylphenol resin is preferable.

Novolac resin is resin in which at least one kind of phenols is copolymerized with at least one kind of aldehydes or ketons under a presence of acid catalyst. In particular, mixed phenols including m-cresol, p-cresol, 2,5-Xylenol, 3,5-Xylenol and resolcinol; or polycondensation material of mixed phenols including phenol, m-cresol and p-cresol, and formaldehyde, where a weight-average molecular weight (MW) in conversion of polystylene through a gel permeation chromatography measurement is preferably 1,500 to 10,000.

Resol resin is resin similarly polycondensated except the fact that alkaline catalyst is used in place of acid catalyst in polycondensation of novolac resin.

Polyvinyl phenol resin is resin in which either one kind of or two kinds or more of hydroxystylene, for example, are polymerized under a presence of radical polymerization initiator or cation polymerization initiator. It is preferable to apply either a polymerization substance of hydroxystylene having alkyl group with carbon numbers 1 to 4 in a benzene ring as substituent or polymerization substance of hydroxystylene of benzene ring with no substituent.

Photothermal conversion pigment has an absorbing region at a part of or an entire near-infrared wavelength region of 650 to 1300 nm, a characteristic for absorbing a laser beam in the near-infrared wavelength region and providing a thermal decomposition and contributes to a low molecular formation of alkaline solubilization and ablasion caused by thermal cutting of molecules in alkaline soluble organic high-molecular substance having the aforesaid phenolic hydroxyl group.

As photothermal conversion pigment, the photothermal conversion pigment described in Japanese Patent Laid-Open No. Hei 11 (1999)-231515 such as organic or non-organic pigment or dyestuff, organic pigment, metal, metal oxide, metal carbide, metal boride and the like having an absorbing region at either a part of or an entire near-infrared region of 650 to 1300 nm can be applied fully as they are, and so-called cyanine type pigment in a broad sense or the like can be applied as a representative one in which complex rings including nitrogen atom, oxygen atom or sulfur atom and the like are coupled with polymethine ($-CH=$)$_n$, and more practically, quinoline type (so-called cyanine type), indole type (so-called indocyanine type), benzothiazole type (so-called thiocyanine type), iminocyclohexadiene type (so-called polymethine type), pyrylium type, thiapyrylium type, squarylium type, chroconium type, and azulenium type can be applied and in particular, it is preferable to apply quinoline type, indole type, benzothiazole type, iminocyclohexadiene type, pyrylium type, thiapyrylium type.

The developer agent of the present invention includes a) water; b) either one of or two kinds or more of tetramethyl ammonium hydroxide, benzyl triethyl ammonium hydroxide, benzyl trimethyl ammonium hydroxide, tetrabutyl ammonium hydroxide, tetrapropyl ammonium hydroxide, ortho silicate soda, potassium hydroxide sodium hydroxide, sal soda applied as either organic or non-organic alkali capable of becoming a major material; and c) either one of or two kinds or more of potassium pyrophosphate, tripolyphosphate soda, hexametaphosphoric soda, triphosphate soda and monophosphate soda applied as liquid agent having dampening action for preventing a reduction in pH value.

Surface active agent and developing promoter agent can be added in their appropriate rate.

As this water, either distilled water or tap water can be used.

PREFERRED EMBODIMENT OF THE INVENTION

Preferred embodiments in Tables 1 to 15 and the comparative example in Table 16 were carried out such that a process roll was fixed to a photosensitive film coating device (manufactured by Think Laboratory Co., Ltd.) installed in a coating chamber kept at a humidity of 40%, a positive type photosensitive compound (manufactured by Mitsubishi Chemical Co., Ltd.) was coated on the roll, then it was dried up to 130° C., a positive type photosensitive film was formed in such a way that its residual solvent might become 2% or less and its film thickness might become about 2 to 3 μm, a laser with a wavelength of 830 nm was illuminated, radiated to cause the film to be exposed, a positive type latent image was drawn on it and the tested roll was made and a development was carried out.

Original liquid of developer agent for positive type photosensitive compound with a rate of composition indicated in each of the preferred embodiments in the tables was made, water and the original liquid was applied to clean the tank with a rate of 3:1 so as to cause the tank in the developing device to become full (50 litters), a developing was carried out at 25° C., and a presence or non-presence of the residual substance, aging capability and developing processing capabilities were checked. The developing processing capability was calculated through a conversion of area after performing an entire developing operation for a non-exposed roll.

TABLE 1

|   |   | *Embdmt 1 | *Embdmt 2 | *Embdmt 3 | *Embdmt 4 | *Embdmt 5 | *Embdmt 6 | *Embdmt 7 | *Embdmt 8 | *EEmbdmt 9 | *Embdmt 10 |
|---|---|---|---|---|---|---|---|---|---|---|---|
| b | tetramethyl ammonium hydroxide | — | 4.6 wt % | — | — | — | — | — | — | — | — |
|   | tetrabutyl ammonium hydroxide | — | — | 4.6 wt % | — | — | — | — | — | — | — |
|   | tetrapropyl ammonium hydroxide | — | — | — | 4.6 wt % | — | — | — | — | — | — |
|   | benzyltriethyl ammonium hydroxide | — | — | — | — | 4.6 wt % | — | — | — | — | — |
|   | benzyltrimethyl ammonium hydroxide | — | — | — | — | — | 4.6 wt % | — | — | — | — |
|   | orthosilicic soda | — | — | — | — | — | — | 4.6 wt % | — | — | — |
|   | potassium hydroxide | — | — | — | — | — | — | — | 4.6 wt % | — | — |
|   | sodium hydroxide | — | — | — | — | — | — | — | — | 4.6 wt % | — |
|   | sal soda | — | — | — | — | — | — | — | — | — | 4.6 wt % |
| c | tri-hosphate soda | 4.8 wt % | 4.8 wt % | 4.8 wt % | 4.8 wt % | 4.8 wt % | 4.8 wt % | 4.8 wt % | 4.8 wt % | 4.8 wt % | 4.8 wt % |
|   | monophosphate soda | — | — | — | — | — | — | — | — | — | — |
|   | potassium pyrophosphate | — | — | — | — | — | — | — | — | — | — |
|   | tripoly-phosphate soda | — | — | — | — | — | — | — | — | — | — |
|   | hexamethaphosphate soda | — | — | — | — | — | — | — | — | — | — |
|   | Total amount including water | 100 wt % | 100 wt % | 100 wt % | 100 wt % | 100 wt % | 100 wt % | 100 wt % | 100 wt % | 100 wt % | 100 wt % |
| Results | Developing characteristic | No residual good | No residual good | No residual good | No residual good | No residual good | No residual good | No residual good | No residual good | No residual good | o residual good |
|   | Aging capability |   |   |   |   |   |   |   |   |   |   |
|   | **Processing capability | ○ | ○ | ○ | ○ | ○ | ○ | ○ | Δ | Δ | Δ |

Note:
*"Embdmt" is an abbreviation of Embodiment.
**Processing capability
○: 600 rolls
Δ: 300 rolls

TABLE 2

|   |   | *Embdmt 11 | *Embdmt 12 | *Embdmt 13 | *Embdmt 14 | *Embdmt 15 | *Embdmt 16 | *Embdmt 17 | *Embdmt 18 | *Embdmt 19 | *Embdmt 20 |
|---|---|---|---|---|---|---|---|---|---|---|---|
| b | tetramethyl ammonium hydroxide | — | 4.6 wt % | — | — | — | — | — | — | — | — |
|   | tetrabutyl ammonium hydroxide | — | — | 4.6 wt % | — | — | — | — | — | — | — |
|   | tetrapropyl ammonium hydroxide | — | — | — | 4.6 wt % | — | — | — | — | — | — |
|   | benzyltriethyl ammonium hydroxide | — | — | — | — | 4.6 wt % | — | — | — | — | — |
|   | benzyltrimethyl ammonium hydroxide | — | — | — | — | — | 4.6 wt % | — | — | — | — |
|   | orthosilicic soda | — | — | — | — | — | — | 4.6 wt % | — | — | — |
|   | potassium hydroxide | — | — | — | — | — | — | — | 4.6 wt % | — | — |
|   | sodium hydroxide | — | — | — | — | — | — | — | — | 4.6 wt % | — |

TABLE 2-continued

|   |   | *Embdmt 11 | *Embdmt 12 | *Embdmt 13 | *Embdmt 14 | *Embdmt 15 | *Embdmt 16 | *Embdmt 17 | *Embdmt 18 | *Embdmt 19 | *Embdmt 20 |
|---|---|---|---|---|---|---|---|---|---|---|---|
|   | sal soda | — | — | — | — | — | — | — | — | — | 4.6 wt % |
| c | trihosphate soda | — | — | — | — | — | — | — | — | — | — |
|   | monophosphate soda | 4.8 wt % | 4.8 wt % | 4.8 wt % | 4.8 wt % | 4.8 wt % | 4.8 wt % | 4.8 wt % | 4.8 wt % | 4.8 wt % | 4.8 wt % |
|   | potassium pyrophosphate | — | — | — | — | — | — | — | — | — | — |
|   | tripolyphosphate soda | — | — | — | — | — | — | — | — | — | — |
|   | hexamethaphosphate soda | — | — | — | — | — | — | — | — | — | — |
|   | Total amount including water | 100 wt % | 100 wt % | 100 wt % | 100 wt % | 100 wt % | 100 wt % | 100 wt % | 100 wt % | 100 wt % | 100 wt % |
| Results | Developing characteristic | No residual | No residual | No residual | No residual ual | No residual | No residual | No residual | No residual | No residual | o residual |
|   | Aging capability | good | good | good | good | good | good | good | good | good | good |
|   | **Processing capability | Δ | Δ | Δ | Δ | Δ | Δ | Δ | □ | □ | □ |

Note:
*"Embdmt" is an abbreviation of Embodiment.
**Processing capability
Δ: 300 rolls
□: 100 rolls

TABLE 3

|   |   | *Embdmt 21 | *Embdmt 22 | *Embdmt 23 | *Embdmt 24 | *Embdmt 25 | *Embdmt 26 | *Embdmt 27 | *Embdmt 28 | *Embdmt 29 | *Embdmt 30 |
|---|---|---|---|---|---|---|---|---|---|---|---|
| b | tetramethyl ammonium hydroxide | — | 4.6 wt % | — | — | — | — | — | — | — | — |
|   | tetrabutyl ammonium hydroxide | — | — | 4.6 wt % | — | — | — | — | — | — | — |
|   | tetrapropyl ammonium hydroxide | — | — | — | 4.6 wt % | — | — | — | — | — | — |
|   | benzyltriethyl ammonium hydroxide | — | — | — | — | 4.6 wt % | — | — | — | — | — |
|   | benzyltrimethyl ammonium hydroxide | — | — | — | — | — | 4.6 wt % | — | — | — | — |
|   | orthosilicic soda | — | — | — | — | — | — | 4.6 wt % | — | — | — |
|   | potassium hydroxide | — | — | — | — | — | — | — | 4.6 wt % | — | — |
|   | sodium hydroxide | — | — | — | — | — | — | — | — | 4.6 wt % | — |
|   | sal soda | — | — | — | — | — | — | — | — | — | 4.6 wt % |
| c | trihosphate soda | — | — | — | — | — | — | — | — | — | — |
|   | monophosphate soda | — | — | — | — | — | — | — | — | — | — |
|   | potassium pyrophosphate | 4.8 wt % | 4.8 wt % | 4.8 wt % | 4.8 wt % | 4.8 wt % | 4.8 wt % | 4.8 wt % | 4.8 wt % | 4.8 wt % |   |
|   | tripolyphosphate soda | — | — | — | — | — | — | — | — | — |   |
|   | hexamethaphosphate soda | — | — | — | — | — | — | — | — | — |   |
|   | Total amount including water | 100 wt % | 100 wt % | 100 wt % | 100 wt % | 100 wt % | 100 wt % | 100 wt % | 100 wt % | 100 wt % |   |

TABLE 3-continued

|  |  | *Em-bdmt 21 | *Em-bdmt 22 | *Em-bdmt 23 | *Em-bdmt 24 | *Em-bdmt 25 | *Em-bdmt 26 | *Em-bdmt 27 | *Em-bdmt 28 | *Em-bdmt 29 | *Em-bdmt 30 |
|---|---|---|---|---|---|---|---|---|---|---|---|
| Results | Developing characteristic | No residual | No residual | No residual | No residual | No residual | No residual | No residual | No residual | No residual | o residual |
|  | Aging capability | good | good | good | good | good | good | good | good | good | good |
|  | **Processing capability | ○ | ○ | ○ | ○ | ○ | ○ | ○ | Δ | Δ | Δ |

Note:
*"Embdmt" is an abbreviation of Embodiment.
**Processing capability
○: 600 rolls
Δ: 300 rolls

TABLE 4

|  |  | *Em-bdmt 31 | *Em-bdmt 32 | *Em-bdmt 33 | *Em-bdmt 34 | *Em-bdmt 35 | *Em-bdmt 36 | *Em-bdmt 37 | *Em-bdmt 38 | *Em-bdmt 39 | *Em-bdmt 40 |
|---|---|---|---|---|---|---|---|---|---|---|---|
| b | tetramethyl ammonium hydroxide | — | 4.6 wt % | — | — | — | — | — | — | — | — |
|  | tetrabutyl ammonium hydroxide | — | — | 4.6 wt % | — | — | — | — | — | — | — |
|  | tetrapropyl ammonium hydroxide | — | — | — | 4.6 wt % | — | — | — | — | — | — |
|  | benzyltriethyl ammonium hydroxide | — | — | — | — | 4.6 wt % | — | — | — | — | — |
|  | benzyltrimethyl ammonium hydroxide | — | — | — | — | — | 4.6 wt % | — | — | — | — |
|  | orthosilicic soda | — | — | — | — | — | — | 4.6 wt % | — | — | — |
|  | potassium hydroxide | — | — | — | — | — | — | — | 4.6 wt % | — | — |
|  | sodium hydroxide | — | — | — | — | — | — | — | — | 4.6 wt % | — |
|  | sal soda | — | — | — | — | — | — | — | — | — | 4.6 wt % |
| c | tri-hosphate soda | — | — | — | — | — | — | — | — | — | — |
|  | monophosphate soda | — | — | — | — | — | — | — | — | — | — |
|  | potassium pyrophosphate | — | — | — | — | — | — | — | — | — | — |
|  | tripoly-phosphate soda | 4.8 wt % | 4.8 wt % | 4.8 wt % | 4.8 wt % | 4.8 wt % | 4.8 wt % | 4.8 wt % | 4.8 wt % | 4.8 wt % | 4.8 wt % |
|  | hexamethaphos-phate soda | — | — | — | — | — | — | — | — | — | — |
|  | Total amount including water | 100 wt % | 100 wt % | 100 wt % | 100 wt % | 100 wt % | 100 wt % | 100 wt % | 100 wt % | 100 wt % | 100 wt % |
| Results | Developing characteristic | No residual | No residual | No residual | No residual | No residual | No residual | No residual | No residual | No residual | No residual |
|  | Aging capability | good | good | good | good | good | good | good | good | good | good |
|  | **Processing capability | Δ | Δ | Δ | Δ | Δ | Δ | Δ | □ | □ | □ |

Note:
*"Embdmt" is an abbreviation of Embodiment.
**Processing capability
Δ: 300 rolls
□: 100 rolls

TABLE 5

|  |  | *Em-bdmt 41 | *Em-bdmt 42 | *Em-bdmt 43 | *Em-bdmt 44 | *Em-bdmt 45 | *Em-bdmt 46 | *Em-bdmt 47 | *Em-bdmt 48 | *Em-bdmt 49 | *Em-bdmt 50 |
|---|---|---|---|---|---|---|---|---|---|---|---|
| b | tetramethyl ammonium | — | 4.6 wt % | — | — | — | — | — | — | — | — |

TABLE 5-continued

| | | *Embdmt 41 | *Embdmt 42 | *Embdmt 43 | *Embdmt 44 | *Embdmt 45 | *Embdmt 46 | *Embdmt 47 | *Embdmt 48 | *Embdmt 49 | *Embdmt 50 |
|---|---|---|---|---|---|---|---|---|---|---|---|
| | hydroxide | — | — | — | — | — | — | — | — | — | — |
| | tetrabutyl ammonium hydroxide | — | — | 4.6 wt % | — | — | — | — | — | — | — |
| | tetrapropyl ammonium hydroxide | — | — | — | 4.6 wt % | — | — | — | — | — | — |
| | benzyltriethyl ammonium hydroxide | — | — | — | — | 4.6 wt % | — | — | — | — | — |
| | benzyltrimethyl ammonium hydroxide | — | — | — | — | — | 4.6 wt % | — | — | — | — |
| | orthosilicic soda | — | — | — | — | — | — | 4.6 wt % | — | — | — |
| | potassium hydroxide | — | — | — | — | — | — | — | 4.6 wt % | — | — |
| | sodium hydroxide | — | — | — | — | — | — | — | — | 4.6 wt % | — |
| | sal soda | — | — | — | — | — | — | — | — | — | 4.6 wt % |
| c | triphosphate soda | — | — | — | — | — | — | — | — | — | — |
| | monophosphate soda | — | — | — | — | — | — | — | — | — | — |
| | potassium pyrophosphate | — | — | — | — | — | — | — | — | — | — |
| | tripolyphosphate soda | — | — | — | — | — | — | — | — | — | — |
| | hexamethaphosphate soda | 4.8 wt % | 4.8 wt % | 4.8 wt % | 4.8 wt % | 4.8 wt % | 4.8 wt % | 4.8 wt % | 4.8 wt % | 4.8 wt % | 4.8 wt % |
| | Total amount including water | 100 wt % | 100 wt % | 100 wt % | 100 wt % | 100 wt % | 100 wt % | 100 wt % | 100 wt % | 100 wt % | 100 wt % |
| Results | Developing characteristic | No residual | No residual | No residual | No residual | No residual | No residual | No residual | No residual | No residual | No residual |
| | Aging capability | good | good | good | good | good | good | good | good | good | good |
| | **Processing capability | Δ | Δ | Δ | Δ | Δ | Δ | Δ | □ | □ | □ |

Note:
*"Embdmt" is an abbreviation of Embodiment.
**Processing capability
Δ: 300 rolls
□: 100 rolls

TABLE 6

| | | *Embdmt 51 | *Embdmt 52 | *Embdmt 53 | *Embdmt 54 | *Embdmt 55 | *Embdmt 56 | *Embdmt 57 | *Embdmt 58 | *Embdmt 59 | *Embdmt 60 |
|---|---|---|---|---|---|---|---|---|---|---|---|
| b | tetramethyl ammonium hydroxide | — | 4.6 wt % | — | — | — | — | — | — | — | — |
| | tetrabutyl ammonium hydroxide | — | — | 4.6 wt % | — | — | — | — | — | — | — |
| | tetrapropyl ammonium hydroxide | — | — | — | 4.6 wt % | — | — | — | — | — | — |
| | benzyltriethyl ammonium hydroxide | — | — | — | — | 4.6 wt % | — | — | — | — | — |
| | benzyltrimethyl ammonium hydroxide | — | — | — | — | — | 4.6 wt % | — | — | — | — |
| | orthosilicic soda | — | — | — | — | — | — | 4.6 wt % | — | — | — |
| | potassium hydroxide | — | — | — | — | — | — | — | 4.6 wt % | — | — |
| | sodium hydroxide | — | — | — | — | — | — | — | — | 4.6 wt % | — |
| | sal soda | — | — | — | — | — | — | — | — | — | 4.6 wt % |

TABLE 6-continued

|   |   | *Em-bdmt 51 | *Em-bdmt 52 | *Em-bdmt 53 | *Em-bdmt 54 | *Em-bdmt 55 | *Em-bdmt 56 | *Em-bdmt 57 | *Em-bdmt 58 | *Em-bdmt 59 | *Em-bdmt 60 |
|---|---|---|---|---|---|---|---|---|---|---|---|
| c | tri-hosphate soda | 1.2 wt % | 1.2 wt % | 1.2 wt % | 1.2 wt % | 1.2 wt % | 1.2 wt % | 1.2 wt % | 1.2 wt % | 1.2 wt % | 1.2 wt % |
|   | monophosphate soda | 1.2 wt % | 1.2 wt % | 1.2 wt % | 1.2 wt % | 1.2 wt % | 1.2 wt % | 1.2 wt % | 1.2 wt % | 1.2 wt % | 1.2 wt % |
|   | potassium pyrophosphate | 2.4 wt % | 2.4 wt % | 2.4 wt % | 2.4 wt % | 2.4 wt % | 2.4 wt % | 2.4 wt % | 2.4 wt % | 2.4 wt % | 2.4 wt % |
|   | tripoly-phosphate soda | — | — | — | — | — | — | — | — | — | — |
|   | hexamethaphos-phate soda | — | — | — | — | — | — | — | — | — | — |
|   | Total amount including water | 100 wt % | 100 wt % | 100 wt % | 100 wt % | 100 wt % | 100 wt % | 100 wt % | 100 wt % | 100 wt % | 100 wt % |
| Results | Developing characteristic | No residual | No residual | No residual | No residual | No residual | No residual | No residual | No residual | No residual | No residual |
|   | Aging capability | good | good | good | good | good | good | good | good | good | good |
|   | **Processing capability | ○ | ○ | ○ | ○ | ○ | ○ | ○ | Δ | Δ | Δ |

Note:
*"Embdmt" is an abbreviation of Embodiment.
**Processing capability
○: 600 rolls
Δ: 300 rolls

TABLE 7

|   |   | *Em-bdmt 61 | *Em-bdmt 62 | *Em-bdmt 63 | *Em-bdmt 64 | *Em-bdmt 65 | *Em-bdmt 66 | *Em-bdmt 68 | *Em-bdmt 69 | *Em-bdmt 70 |
|---|---|---|---|---|---|---|---|---|---|---|
| b | tetramethyl ammonium hydroxide | — | 2.4 wt % | — | — | — | — | — | — | — |
|   | tetrabutyl ammonium hydroxide | — | — | 2.4 wt % | — | — | — | — | — | — |
|   | tetrapropyl ammonium hydroxide | — | — | — | 2.4 wt % | — | — | — | — | — |
|   | benzyltriethyl ammonium hydroxide | — | — | — | — | 2.4 wt % | — | — | — | — |
|   | benzyltrimethyl ammonium hydroxide | — | — | — | — | — | 2.4 wt % | — | — | — |
|   | orthosilicic soda | 2.4 wt % | 2.4 wt % | 2.4 wt % | 2.4 wt % | 2.4 wt % | 2.4 wt % | 2.4 wt % | 2.4 wt % | 2.4 wt % |
|   | potassium hydroxide | — | — | — | — | — | — | 2.4 wt % | — | — |
|   | sodium hydroxide | — | — | — | — | — | — | — | 2.4 wt % | — |
|   | sal soda | — | — | — | — | — | — | — | — | 2.4 wt % |
| c | tri-hosphate soda | 4.8 wt % | 4.8 wt % | 4.8 wt % | 4.8 wt % | 4.8 wt % | 4.8 wt % | 4.8 wt % | 4.8 wt % | 4.8 wt % |
|   | monophosphate soda | — | — | — | — | — | — | — | — | — |
|   | potassium pyrophosphate | — | — | — | — | — | — | — | — | — |
|   | tripoly-phosphate soda | — | — | — | — | — | — | — | — | — |
|   | hexamethaphos-phate soda | — | — | — | — | — | — | — | — | — |
|   | Total amount including water | 100 wt % | 100 wt % | 100 wt % | 100 wt % | 100 wt % | 100 wt % | 100 wt % | 100 wt % | 100 wt % |

TABLE 7-continued

|  |  | *Embdmt 61 | *Embdmt 62 | *Embdmt 63 | *Embdmt 64 | *Embdmt 65 | *Embdmt 66 | *Embdmt 68 | *Embdmt 69 | *Embdmt 70 |
|---|---|---|---|---|---|---|---|---|---|---|
| Results | Developing characteristic | No residual good | No residual good | No residual good | No residual good | No residual good | No residual good | No residual good | No residual good | No residual good |
|  | Aging capability | | | | | | | | | |
|  | **Processing capability | ○ | ○ | ○ | ○ | ○ | ○ | Δ | Δ | Δ |

Note:
*"Embdmt" is an abbreviation of Embodiment.
**Processing capability
○: 600 rolls
Δ: 300 rolls

TABLE 8

|  |  | *Embdmt 71 | *Embdmt 72 | *Embdmt 73 | *Embdmt 74 | *Embdmt 75 | *Embdmt 76 | *Embdmt 78 | *Embdmt 79 | *Embdmt 80 |
|---|---|---|---|---|---|---|---|---|---|---|
| b | tetramethyl ammonium hydroxide | — | 2.4 wt % | — | — | — | — | — | — | — |
|  | tetrabutyl ammonium hydroxide | — | — | 2.4 wt % | — | — | — | — | — | — |
|  | tetrapropyl ammonium hydroxide | — | — | — | 2.4 wt % | — | — | — | — | — |
|  | benzyltriethyl ammonium hydroxide | — | — | — | — | 2.4 wt % | — | — | — | — |
|  | benzyltrimethyl ammonium hydroxide | — | — | — | — | — | 2.4 wt % | — | — | — |
|  | orthosilicic soda | 2.4 wt % | 2.4 wt % | 2.4 wt % | 2.4 wt % | 2.4 wt % | 2.4 wt % | 2.4 wt % | 2.4 wt % | 2.4 wt % |
|  | potassium hydroxide | — | — | — | — | — | — | 2.4 wt % | — | — |
|  | sodium hydroxide | — | — | — | — | — | — | — | 2.4 wt % | — |
|  | sal soda | — | — | — | — | — | — | — | — | 2.4 wt % |
| c | trihosphate soda | — | — | — | — | — | — | — | — | — |
|  | monophosphate soda | — | — | — | — | — | — | — | — | — |
|  | potassium pyrophosphate | 4.8 wt % | 4.8 wt % | 4.8 wt % | 4.8 wt % | 4.8 wt % | 4.8 wt % | 4.8 wt % | 4.8 wt % | 4.8 wt % |
|  | tripolyphosphate soda | — | — | — | — | — | — | — | — | — |
|  | hexamethaphosphate soda | — | — | — | — | — | — | — | — | — |
|  | Total amount including water | 100 wt % | 100 wt % | 100 wt % | 100 wt % | 100 wt % | 100 wt % | 100 wt % | 100 wt % | 100 wt % |
| Results | Developing characteristic | No residual good | No residual good | No residual good | No residual good | No residual good | No residual good | No residual good | No residual good | No residual good |
|  | Aging capability | | | | | | | | | |
|  | **Processing capability | ○ | ○ | ○ | ○ | ○ | ○ | Δ | Δ | Δ |

Note:
*"Embdmt" is an abbreviation of Embodiment.
**Processing capability
○: 600 rolls
Δ: 300 rolls

TABLE 9

|  |  | *Embdmt 81 | *Embdmt 82 | *Embdmt 83 | *Embdmt 84 | *Embdmt 85 | *Embdmt 86 | *Embdmt 87 | *Embdmt 89 | *Embdmt 90 |
|---|---|---|---|---|---|---|---|---|---|---|
| b | tetramethyl ammonium | — | 2.4 wt % | — | — | — | — | — | — | — |

TABLE 9-continued

|   |   | *Embdmt 81 | *Embdmt 82 | *Embdmt 83 | *Embdmt 84 | *Embdmt 85 | *Embdmt 86 | *Embdmt 87 | *Embdmt 89 | *Embdmt 90 |
|---|---|---|---|---|---|---|---|---|---|---|
|   | hydroxide tetrabutyl ammonium hydroxide | — | — | 2.4 wt % | — | — | — | — | — | — |
|   | tetrapropyl ammonium hydroxide | — | — | — | 2.4 wt % | — | — | — | — | — |
|   | benzyltriethyl ammonium hydroxide | — | — | — | — | 2.4 wt % | — | — | — | — |
|   | benzyltrimethyl ammonium hydroxide | — | — | — | — | — | 2.4 wt % | — | — | — |
|   | orthosilicic soda | — | — | — | — | — | — | 2.4 wt % | — | — |
|   | potassium hydroxide | 2.4 wt % | 2.4 wt % | 2.4 wt % | 2.4 wt % | 2.4 wt % | 2.4 wt % | 2.4 wt % | 2.4 wt % | 2.4 wt % |
|   | sodium hydroxide | — | — | — | — | — | — | — | 2.4 wt % | — |
|   | sal soda | — | — | — | — | — | — | — | — | 2.4 wt % |
| c | triphosphate soda | — | — | — | — | — | — | — | — | — |
|   | monophosphate soda | — | — | — | — | — | — | — | — | — |
|   | potassium pyrophosphate | 4.8 wt % | 4.8 wt % | 4.8 wt % | 4.8 wt % | 4.8 wt % | 4.8 wt % | 4.8 wt % | 4.8 wt % | 4.8 wt % |
|   | tripolyphosphate soda | — | — | — | — | — | — | — | — | — |
|   | hexamethaphosphate soda | — | — | — | — | — | — | — | — | — |
|   | Total amount including water | 100 wt % | 100 wt % | 100 wt % | 100 wt % | 100 wt % | 100 wt % | 100 wt % | 100 wt % | 100 wt % |
| Results | Developing characteristic | No residual ual good | No residual good | No residual good | No residual good | No residual good | No residual good | No residual good | No residual good | No residual good |
|   | Aging capability |   |   |   |   |   |   |   |   |   |
|   | **Processing capability | Δ | Δ | Δ | Δ | Δ | Δ | Δ | ☐ | ☐ |

Note:
*"Embdmt" is an abbreviation of Embodiment.
**Processing capability
Δ: 300 rolls
☐: 100 rolls

TABLE 10

|   |   | *Embdmt 91 | *Embdmt 92 | *Embdmt 93 | *Embdmt 94 | *Embdmt 95 | *Embdmt 96 | *Embdmt 97 | *Embdmt 98 | *Embdmt 100 |
|---|---|---|---|---|---|---|---|---|---|---|
| b | tetramethyl ammonium hydroxide | — | 2.4 wt % | — | — | — | — | — | — | — |
|   | tetrabutyl ammonium hydroxide | — | — | 2.4 wt % | — | — | — | — | — | — |
|   | tetrapropyl ammonium hydroxide | — | — | — | 2.4 wt % | — | — | — | — | — |
|   | benzyltriethyl ammonium hydroxide | — | — | — | — | 2.4 wt % | — | — | — | — |
|   | benzyltrimethyl ammonium hydroxide | — | — | — | — | — | 2.4 wt % | — | — | — |
|   | orthosilicic soda | — | — | — | — | — | — | 2.4 wt % | — | — |
|   | potassium hydroxide | — | — | — | — | — | — | — | 2.4 wt % | — |
|   | sodium hydroxide | 2.4 wt % | 2.4 wt % | 2.4 wt % | 2.4 wt % | 2.4 wt % | 2.4 wt % | 2.4 wt % | 2.4 wt % | 2.4 wt % |
|   | sal soda | — | — | — | — | — | — | — | — | 2.4 wt % |

TABLE 10-continued

|   |   | *Embdmt 91 | *Embdmt 92 | *Embdmt 93 | *Embdmt 94 | *Embdmt 95 | *Embdmt 96 | *Embdmt 97 | *Embdmt 98 | *Embdmt 100 |
|---|---|---|---|---|---|---|---|---|---|---|
| c | tri-hosphate soda | — | — | — | — | — | — | — | — | — |
|   | monophosphate soda | — | — | — | — | — | — | — | — | — |
|   | potassium pyrophosphate | 4.8 wt % | 4.8 wt % | 4.8 wt % | 4.8 wt % | 4.8 wt % | 4.8 wt % | 4.8 wt % | 4.8 wt % | 4.8 wt % |
|   | tripoly-phosphate soda | — | — | — | — | — | — | — | — | — |
|   | hexamethaphosphate soda | — | — | — | — | — | — | — | — | — |
|   | Total amount including water | 100 wt % | 100 wt % | 100 wt % | 100 wt % | 100 wt % | 100 wt % | 100 wt % | 100 wt % | 100 wt % |
| Results | Developing characteristic | No residual | No residual | No residual | No residual | No residual | No residual | No residual | No residual | No residual |
|   | Aging capability | good | good | good | good | good | good | good | good | good |
|   | **Processing capability | Δ | Δ | Δ | Δ | Δ | Δ | Δ | ▫ | ▫ |

Note:
*"Embdmt" is an abbreviation of Embodiment.
**Processing capability
Δ: 300 rolls
▫: 100 rolls

TABLE 11

|   |   | *Embdmt 101 | *Embdmt 102 | *Embdmt 103 | *Embdmt 104 | *Embdmt 105 | *Embdmt 106 | *Embdmt 107 | *Embdmt 108 | *Embdmt 109 |
|---|---|---|---|---|---|---|---|---|---|---|
| b | tetramethyl ammonium hydroxide | — | 2.4 wt % | — | — | — | — | — | — | — |
|   | tetrabutyl ammonium hydroxide | — | — | 2.4 wt % | — | — | — | — | — | — |
|   | tetrapropyl ammonium hydroxide | — | — | — | 2.4 wt % | — | — | — | — | — |
|   | benzyltriethyl ammonium hydroxide | — | — | — | — | 2.4 wt % | — | — | — | — |
|   | benzyltrimethyl ammonium hydroxide | — | — | — | — | — | 2.4 wt % | — | — | — |
|   | orthosilicic soda | — | — | — | — | — | — | 2.4 wt % | — | — |
|   | potassium hydroxide | — | — | — | — | — | — | — | 2.4 wt % | — |
|   | sodium hydroxide | — | — | — | — | — | — | — | — | 2.4 wt % |
|   | sal soda | 2.4 wt % | 2.4 wt % | 2.4 wt % | 2.4 wt % | 2.4 wt % | 2.4 wt % | 2.4 wt % | 2.4 wt % | 2.4 wt % |
| c | tri-hosphate soda | — | — | — | — | — | — | — | — | — |
|   | monophosphate soda | — | — | — | — | — | — | — | — | — |
|   | potassium pyrophosphate | 4.8 wt % | 4.8 wt % | 4.8 wt % | 4.8 wt % | 4.8 wt % | 4.8 wt % | 4.8 wt % | 4.8 wt % | 4.8 wt % |
|   | tripoly-phosphate soda | — | — | — | — | — | — | — | — | — |
|   | hexamethaphosphate soda | — | — | — | — | — | — | — | — | — |
|   | Total amount including water | 100 wt % | 100 wt % | 100 wt % | 100 wt % | 100 wt % | 100 wt % | 100 wt % | 100 wt % | 100 wt % |

TABLE 11-continued

|  |  | *Embdmt 101 | *Embdmt 102 | *Embdmt 103 | *Embdmt 104 | *Embdmt 105 | *Embdmt 106 | *Embdmt 107 | *Embdmt 108 | *Embdmt 109 |
|---|---|---|---|---|---|---|---|---|---|---|
| Results | Developing characteristic | No residual good | No residual good | No residual good | No residual good | No residual good | No residual good | No residual good | No residual good | No residual good |
|  | Aging capability |  |  |  |  |  |  |  |  |  |
|  | **Processing capability | Δ | Δ | Δ | Δ | Δ | Δ | Δ | ☐ | ☐ |

Note:
*"Embdmt" is an abbreviation of Embodiment.
**Processing capability
Δ: 300 rolls
☐: 100 rolls

TABLE 12

|  |  | *Embdmt 111 | *Embdmt 112 | *Embdmt 113 | *Embdmt 114 | *Embdmt 115 | *Embdmt 116 |
|---|---|---|---|---|---|---|---|
| b | tetramethyl ammonium hydroxide | — | 2.4 wt % | — | — | — | — |
|  | tetrabutyl ammonium hydroxide | — | — | 2.4 wt % | — | — | — |
|  | tetrapropyl ammonium hydroxide | — | — | — | 2.4 wt % | — | — |
|  | benzyltriethyl ammonium hydroxide | — | — | — | — | 2.4 wt % | — |
|  | benzyltrimethyl ammonium hydroxide | — | — | — | — | — | 2.4 wt % |
|  | ortho-silicic soda | 1.2 wt % | 1.2 wt % | 1.2 wt % | 1.2 wt % | 1.2 wt % | 1.2 wt % |
|  | potassium hydroxide | 0.6 wt % | 0.6 wt % | 0.6 wt % | 0.6 wt % | 0.6 wt % | 0.6 wt % |
|  | sodium hydroxide | 0.6 wt % | 0.6 wt % | 0.6 wt % | 0.6 wt % | 0.6 wt % | 0.6 wt % |
|  | sal soda | — | — | — | — | — | — |
| c | triphosphate soda | 1.2 wt % | 1.2 wt % | 1.2 wt % | 1.2 wt % | 1.2 wt % | 1.2 wt % |
|  | monophosphate soda | — | — | — | — | — | — |
|  | potassium pyrophosphate | 3.6 wt % | 3.6 wt % | 3.6 wt % | 3.6 wt % | 3.6 wt % | 3.6 wt % |
|  | tripolyphosphate soda | — | — | — | — | — | — |
|  | hexamethaphosphate soda | — | — | — | — | — | — |
|  | Total amount including water | 100 wt % | 100 wt % | 100 wt % | 100 wt % | 100 wt % | 100 wt % |
| Results | Developing characteistic | No residual good | No residual good | No residual good | No residual good | No residual good | No residual good |
|  | Aging capability |  |  |  |  |  |  |
|  | **Processing capability | ○ | ○ | ○ | ○ | ○ | ○ |

Note:
*"Embdmt" is an abbreviation of Embodiment.
**Processing capability
○: 600 rolls

TABLE 13

|  |  | Embodiment 121 | Embodiment 122 | Embodiment 123 | Embodiment 124 | Embodiment 125 | Embodiment 126 |
|---|---|---|---|---|---|---|---|
| b | tetramethyl ammonium hydroxide | — | 2.4 wt % | — | — | — | — |
|  | tetrabutyl ammonium hydroxide | — | — | 2.4 wt % | — | — | — |
|  | tetrapropyl ammonium hydroxide | — | — | — | 2.4 wt % | — | — |
|  | benzyltriethyl ammonium hydroxide | — | — | — | — | 2.4 wt % | — |
|  | benzyltrimethyl ammonium | — | — | — | — | — | 2.4 wt % |

TABLE 13-continued

|   |   | Embodiment 121 | Embodiment 122 | Embodiment 123 | Embodiment 124 | Embodiment 125 | Embodiment 126 |
|---|---|---|---|---|---|---|---|
|   | hydroxide |   |   |   |   |   |   |
|   | orthosilicic soda | 1.4 wt % | 1.4 wt % | 1.4 wt % | 1.4 wt % | 1.4 wt % | 1.4 wt % |
|   | potassium hydroxide | — | — | — | — | — | — |
|   | sodium hydroxide | — | — | — | — | — | — |
|   | sal soda | 1.0 wt % | 1.0 wt % | 1.0 wt % | 1.0 wt % | 1.0 wt % | 1.0 wt % |
| c | tri-hosphate soda | 1.2 wt % | 1.2 wt % | 1.2 wt % | 1.2 wt % | 1.2 wt % | 1.2 wt % |
|   | monophosphate soda | — | — | — | — | — | — |
|   | potassium pyrophosphate | 3.6 wt % | 3.6 wt % | 3.6 wt % | 3.6 wt % | 3.6 wt % | 3.6 wt % |
|   | tripoly-phosphate soda | — | — | — | — | — | — |
|   | hexamethaphosphate soda | — | — | — | — | — | — |
|   | Total amount including water | 100 wt % | 100 wt % | 100 wt % | 100 wt % | 100 wt % | 100 wt % |
| Results | Developing characteristic | No residual | No residual | No residual | No residual | No residual | No residual |
|   | Aging capability | good | good | good | good | good | good |
|   | **Processing capability | ◯ | ◯ | ◯ | ◯ | ◯ | ◯ |

Note:
**Processing capability
◯: 600 rolls

TABLE 14

|   |   | *Embdmt 131 | *Embdmt 132 | *Embdmt 133 | *Embdmt 134 | *Embdmt 135 | *Embdmt 136 | *Embdmt 137 | *Embdmt 138 |
|---|---|---|---|---|---|---|---|---|---|
| b | tetramethyl ammonium hydroxide | — | — | — | — | — | — | — | — |
|   | tetrabutyl ammonium hydroxide | — | — | — | — | — | — | — | — |
|   | tetrapropyl ammonium hydroxide | — | — | — | — | — | — | — | — |
|   | benzyltriethyl ammonium hydroxide | — | — | — | — | — | — | — | — |
|   | benzyltrimethyl ammonium hydroxide | — | — | — | — | — | — | — | — |
|   | orthosilicic soda | 5.6 wt % | 5.6 wt % | 5.6 wt % | 5.6 wt % | 6.8 wt % | 6.8 wt % | 6.8 wt % | 6.8 wt % |
|   | potassium hydroxide | 2.0 wt % | 2.0 wt % | 2.0 wt % | 2.0 wt % | — | — | — | — |
|   | sodium hydroxide | 2.0 wt % | 2.0 wt % | 2.0 wt % | 2.0 wt % | — | — | — | — |
|   | sal soda | — | — | — | — | 3.0 wt % | 3.0 wt % | 3.0 wt % | 3.0 wt % |
| c | tri-hosphate soda | 1.2 wt % | — | — | — | 1.2 wt % | — | — | — |
|   | monophosphate soda | — | 1.2 wt % | — | — | — | 1.2 wt % | — | — |
|   | potassium pyrophosphate | 3.6 wt % | 3.6 wt % | 3.6 wt % | 3.6 wt % | 3.6 wt % | 3.6 wt % | 3.6 wt % | 3.6 wt % |
|   | tripoly-phosphate soda | — | — | 1.2 wt % | — | — | — | 1.2 wt % | — |
|   | hexamethaphosphate soda | — | — | — | 1.2 wt % | — | — | — | 1.2 wt % |
|   | Total amount including water | 100 wt % | 100 wt % | 100 wt % | 100 wt % | 100 wt % | 100 wt % | 100 wt % | 100 wt % |
| Results | Developing characteristic | No residual | No residual | No residual | No residual | No residual | No residual | No residual | No residual |

TABLE 14-continued

| | *Embdmt 131 | *Embdmt 132 | *Embdmt 133 | *Embdmt 134 | *Embdmt 135 | *Embdmt 136 | *Embdmt 137 | *Embdmt 138 |
|---|---|---|---|---|---|---|---|---|
| Aging capability | good | good | good | good | good | good | good | good |
| **Processing capability | Δ | □ | □ | □ | Δ | □ | □ | □ |

Note:
*"Embdmt" is an abbreviation of Embodiment.
**Processing capability
Δ: 300 rolls
□: 100 rolls

TABLE 15

| | | Embodiment 141 | Embodiment 142 | Embodiment 143 | Embodiment 144 |
|---|---|---|---|---|---|
| b | tetramethyl ammonium hydroxide | — | — | — | — |
| | tetrabutyl ammonium hydroxide | — | — | — | — |
| | tetrapropyl ammonium hydroxide | — | — | — | — |
| | benzyltriethyl ammonium hydroxide | — | — | — | — |
| | benzyltrimethyl ammonium hydroxide | — | — | — | — |
| | ortho-silicic soda | 4.8 wt % | 4.8 wt % | — | — |
| | potassium hydroxide | — | — | 3.6 wt % | 3.6 wt % |
| | sodium hydroxide | — | — | 3.6 wt % | 3.6 wt % |
| | sal soda | — | — | 2.4 wt % | 2.4 wt % |
| c | tri-hosphate soda | 1.2 wt % | — | 1.2 wt % | — |
| | mono-phosphate soda | — | — | — | — |
| | potassium pyro-phosphate | 3.6 wt % | 4.8 wt % | 3.6 wt % | 4.8 wt % |
| | tripoly-phosphate soda | — | — | — | — |
| | hexa-methaphosphate soda | — | — | — | — |
| | Total amount including water | 100 wt % | 100 wt % | 100 wt % | 100 wt % |
| Results | Developing characteristic | No residual | No residual | No residual | No residual |
| | Aging capability | good | good | good | good |
| | **Processing capability | □ | □ | □ | □ |

Note:
**Processing capability
□: 100 rolls

TABLE 16

| | | ***Cmp. Embdmt 1 | ***Cmp. Embdmt 2 | ***Cmp. Embdmt 3 | ***Cmp. Embdmt 4 | ***Cmp. Embdmt 5 | ***Cmp. Embdmt 6 | ***Cmp. Embdmt 7 | ***Cmp. Embdmt 8 | ***Cmp. Embdmt 9 | ***Cmp. Embdmt 10 |
|---|---|---|---|---|---|---|---|---|---|---|---|
| b | tetramethyl ammonium hydroxide | — | 9.6 wt % | — | — | — | — | — | — | — | — |
| | tetrabutyl ammonium hydroxide | — | — | 9.6 wt % | — | — | — | — | — | — | — |
| | tetrapropyl ammonium hydroxide | — | — | — | 9.6 wt % | — | — | — | — | — | — |
| | benzyltriethyl ammonium hydroxide | — | — | — | — | 9.6 wt % | — | — | — | — | — |
| | benzyltrimethyl ammonium | — | — | — | — | — | 9.6 wt % | — | — | — | — |

TABLE 16-continued

|  |  | ***Cmp. Embdmt 1 | ***Cmp. Embdmt 2 | ***Cmp. Embdmt 3 | ***Cmp. Embdmt 4 | ***Cmp. Embdmt 5 | ***Cmp. Embdmt 6 | ***Cmp. Embdmt 7 | ***Cmp. Embdmt 8 | ***Cmp. Embdmt 9 | ***Cmp. Embdmt 10 |
|---|---|---|---|---|---|---|---|---|---|---|---|
|  | hydroxide |  |  |  |  |  |  |  |  |  |  |
|  | ortho-silicic soda | — | — | — | — | — | — | 9.6 wt % | — | — | — |
|  | potassium hydroxide | — | — | — | — | — | — | — | 9.6 wt % | — | — |
|  | sodium hydroxide | — | — | — | — | — | — | — | — | 9.6 wt % | — |
|  | sal soda | — | — | — | — | — | — | — | — | — | 9.6 wt % |
| c | tri-hosphate soda | — | — | — | — | — | — | — | — | — | — |
|  | mono-phosphate soda | — | — | — | — | — | — | — | — | — | — |
|  | potassium pyro-phosphate | — | — | — | — | — | — | — | — | — | — |
|  | tripoly-phosphate soda | — | — | — | — | — | — | — | — | — | — |
|  | hexa-methaphosphate soda | — | — | — | — | — | — | — | — | — | — |
|  | Total amount including water | 100 wt % | 100 wt % | 100 wt % | 100 wt % | 100 wt % | 100 wt % | 100 wt % | 100 wt % | 100 wt % | 100 wt % |
| Results | Developing characteristic | Residual | Residual | Residual | Residual | Residual | Residual | Residual | Residual | Residual | Residual |
|  | Aging capability | bad | bad | bad | bad | bad | bad | bad | bad | bad | bad |
|  | **Processing capability | X | X | X | X | X | X | X | X | X | X |

Note:
***"Cmp. Embdmt" is an abbreviation of Comparative Embodiment.
**Processing capability
X: a few rolls

The invention claimed is:

1. A composition for gravure printing comprising a positive type photosensitive compound for gravure printing having a photosensitive portion exposed and reacted with a near-infrared wavelength region laser, and solubilized in a developer liquid, wherein said developer liquid is comprised of:
   a) water;
   b) either one of or two kinds or more of tetramethyl ammonium hydroxide, benzyl triethyl ammonium hydroxide, beuzyl trimethyl ammonium hydroxide, tetrabutyl ammonium hydroxide, tetrapropyl ammonium hydroxide, potassium hydroxide, sodium hydroxide, applied as either organic or non-organic alkali capable of becoming a major material; and
   c) either one of or two kinds or more of hexametaphosphoric soda, triphosphate soda and monophosphate soda applied as liquid agent having dampening action for preventing a reduction in pH value;
   wherein said developer liquid comprises a pH value of 13.0 or more.

2. A method of developing a photosensitive film comprising
   coating a positive type photosensitive compound for gravure printing on a roll for gravure printing to form a coated photosensitive film,
   exposing said photosensitive film to a near-infrared wavelength region laser to draw a positive type latent image, and
   developing the photosensitive film using a developer liquid, wherein said developer liquid is comprised of:
   a) water;
   b) either one of or two kinds or more of tetramethyl ammonium hydroxide, benzyl triethyl ammonium hydroxide, benzyl trimethyl ammonium hydroxide, tetrabutyl ammonium hydroxide, tetrapropyl ammonium hydroxide, potassium hydroxide, sodium hydroxide applied as either organic or non-organic alkali capable of becoming a major material; and
   c) either one of or two kinds or more of hexametaphosphoric soda, triphosphate soda and monophosphate soda applied as liquid agent having dampening action for preventing a reduction in pH value;
   wherein said developer liquid comprises a pH value of 13.0 or more.

3. The composition according to claim 1, which comprises monophosphate soda.

4. The method according to claim 2, which comprises monophosphate soda.

5. A composition for gravure printing consisting essentially of a positive type photosensitive compound for gravure printing having a photosensitive portion exposed and reacted with a near-infrared wavelength region laser, and solubilized in a developer liquid, wherein said developer liquid is comprised of:

a) water;

b) either one of or two kinds or more of tetramethyl ammonium hydroxide, benzyl triethyl ammonium hydroxide, benzyl trimethyl ammonium hydroxide, tetrabutyl ammonium hydroxide, tetrapropyl ammonium hydroxide, potassium hydroxide, sodium hydroxide applied as either organic or non-organic alkali capable of becoming a major material; and c) either one of or two kinds or more of hexametaphosphoric soda, triphosphate soda and monophosphate soda applied as liquid agent having dampening action for preventing a reduction in pH value;

wherein said developer liquid comprises a pH value of 13.0 or more.

* * * * *